US011848673B1

(12) United States Patent
Grant et al.

(10) Patent No.: US 11,848,673 B1
(45) Date of Patent: Dec. 19, 2023

(54) MAJORITY VOTER WITH ERROR DETECTION

(71) Applicant: Apogee Semiconductor, Inc., Plano, TX (US)

(72) Inventors: David A. Grant, London (GB); Mark Hamlyn, Murphy, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 0 days.

(21) Appl. No.: 18/450,448

(22) Filed: Aug. 16, 2023

Related U.S. Application Data

(60) Provisional application No. 63/371,856, filed on Aug. 18, 2022.

(51) Int. Cl.
*H03K 19/23* (2006.01)
*H03K 19/003* (2006.01)

(52) U.S. Cl.
CPC ........... *H03K 19/23* (2013.01); *H03K 19/003* (2013.01)

(58) Field of Classification Search
None
See application file for complete search history.

(56) References Cited

U.S. PATENT DOCUMENTS

| 3,706,044 | A | 12/1972 | Hintze et al. |
| 4,873,685 | A * | 10/1989 | Millis, Jr. ............. G06F 11/187 |
| | | | 714/E11.069 |
| 5,999,421 | A * | 12/1999 | Liu ................... H02M 3/33523 |
| | | | 363/21.15 |
| 7,668,102 | B2 | 3/2010 | Bae et al. |
| 9,191,009 | B1 | 11/2015 | Clark et al. |

OTHER PUBLICATIONS

Singh et al., "Redundancy Based Design and Analysis of ALU Circuit Using CMOS 180nm Process Technology for Fault Tolerant Computing Architectures," Int. J. Com. Dig. Sys. Vol. 4, No. 1 (Jan. 2015), http://dx.doi.org/10.12785/ijcds/040106.

(Continued)

*Primary Examiner* — Jany Richardson
(74) *Attorney, Agent, or Firm* — Gregory A. Magel

(57) ABSTRACT

An integrated circuit for use in high-reliability electronic systems contains one or more digital majority voters with corresponding disagreement detectors connected to the same input signals producing a majority value output and an error signal that is active when not all input signals agree. Internal error signals from multiple majority voter/disagreement detectors as well as external error inputs may be combined using disjunctive error logic to produce an "error detected" output indication. Cold-sparing and hot-plugging are supported by providing cold-sparable electrostatic discharge protection circuits and power-on reset circuitry controlling cold-sparable output stages. Internal modular redundancy provides immunity to single-event transients as well as enhanced reliability. Redundant electronic systems using the majority voter with error detection are also provided, as are fault notification systems that use the disjunctive error logic and external error input feedthrough capabilities of serially-connected integrated circuits to produce an error indication for a plurality of subsystems.

20 Claims, 9 Drawing Sheets

(56) References Cited

OTHER PUBLICATIONS

Elamaran et al., "Majority voter circuits of TMR configuration—A CMOS VLSI design approach," Int. J. Pure and Appl. Mathematics vol. 119, No. 7 (2018), pp. 2621-2632.
Choudhary et al., "Generalized Majority Voter Design Method for N-Modular Redundant Systems Used in Mission- and Safety-Critical Applications," Computers vol. 8, No. 1 (2019), article 10; doi:10.3390/computers8010010.

* cited by examiner

MAJORITY VOTER WITH ERROR DETECTION

This application claims the benefit under 35 U.S.C. 119(e) of U.S. Provisional Application No. 63/371,856, filed Aug. 18, 2022.

BACKGROUND OF THE INVEINTION

1. Field of the Invention

The present invention relates generally to integrated circuits, and, more particularly, to high-reliability integrated circuits for use in modular redundant fault-tolerant systems.

2. Description of the Related Art

Electronic systems used in harsh environments or high-reliability critical applications may incorporate fault tolerance using methods such as various forms of redundancy. Fault tolerance using redundancy may be implemented at various levels in such systems, from high-level system or subsystem replication and sparing, and software error correction techniques, down to the hardware integrated circuit gate or even device level. Spacecraft and nuclear power exemplify applications having strict requirements for both high reliability and operation in harsh environments; circuits used in such applications may encounter extreme temperatures and ionizing radiation.

Ionizing radiation in particular can cause both permanent degradation of semiconductor devices due to dose effects, and also cause transient effects due to dose-rate effects and single-event effects. In single-event effects (SEEs), impinging ionizing particles, such as cosmic rays, heavy ions, or protons, generate charge that causes temporary voltage glitches (known as single-event transients or SETs) leading to a transient change in an analog level or logic state. Single-event effects of several types resulting from single-event transients may be analog or digital, and while they may be nondestructive, may result in errors or other various forms of functional disruption of a system. Radiation-hardened circuits and devices may be produced to reduce susceptibility to ionizing radiation using specialized integrated circuit fabrication processes and/or various IC design techniques, but redundancy is still used in concert with these techniques for maximum system reliability.

Gate-level redundancy may be used to mitigate single-event effects or other failure mechanisms by replicating functional modules and combining their outputs using various means. Majority voting is one technique that can be used to determine a consensus and thereby mask errors from circuit modules that are generating erroneous signals. Additional circuitry can indicate whether a fault is taking place and in some cases which circuit is failing.

In high-reliability systems, multiple duplicates of circuitry may be maintained, with unused duplicates powered off in a technique called "cold-sparing" in order to reduce power consumption. The inputs and outputs of duplicate circuits may be connected together in parallel, but special circuit designs are required to minimize leakage current in unused (cold-spared) circuitry while it is connected to a powered duplicate.

There is a need for integrated circuits that support system-level redundancy techniques while incorporating cold-sparing features as well as internal redundancy and other Radiation-Hardening By Design (RHBD) approaches to achieve high reliability and radiation tolerance in the integrated circuits themselves.

SUMMARY OF THE INVEINTION

The present invention has been made to address the aforementioned needs, and accordingly it is an object of this invention to provide the functions of at least one majority voter with error detection in an integrated circuit for use in logic systems employing modular redundancy. A digital majority voter produces a logic signal at a voter output having a value equal to the logical value of a majority of voter inputs. Exemplary embodiments of the invention provide at least one digital majority voter, and a disagreement detector associated with each majority voter that generates an active error output signal when not all input signals agree. Features are provided that minimize leakage currents from inputs and outputs to either the power supply terminal or the ground terminal when cold-spared and subjected to nonzero voltages. Internal triple modular redundancy is employed to achieve overall high reliability and high resiliency to the effects of radiation. Disjunctive error logic is used to produce an "error detected" output indication when any of the majority voters with error detection generate an error signal or when an optional external error input is receiving an active error signal.

More specifically, the present invention provides an integrated circuit having a power supply terminal; a ground terminal; a plurality of logic signal inputs and outputs connected to input/output (I/O) pads; at least one digital majority voter having an odd number of three or more voter inputs connected to a corresponding number of the logic signal inputs; and a disagreement detector corresponding to each majority voter and having detector inputs connected to the inputs of its corresponding majority voter, configured to produce an error signal at a detector output that is active when not all of its inputs agree.

In an embodiment, a plurality of majority voters with error detection are provided in the same integrated circuit, and disjunctive error logic is provided that generates an error output that is active when at least one of the detector outputs is producing an error signal. In some embodiments, an external error input is also connected to the input of the disjunctive error logic, so that the error output is active when the external error input is receiving an error signal or when at least one of the detector outputs is producing an error signal.

In another embodiment, a packaged integrated circuit having at least one majority voter with error detection is provided. Some embodiments provide a packaged integrated circuit containing two or more majority voters with error detection, and in one embodiment, an integrated circuit according to the present invention is provided having two majority voters with error detection, disjunctive error logic, and an external error input in an integrated circuit package having fourteen terminals in two rows.

In a further embodiment, a majority voter integrated circuit with error detection having cold-sparable output stages is provided. A cold-sparable output stage has a low-side branch comprising an NMOS transistor with its gate driven by an NMOS drive path, its source connected to ground, and having a drain connected to an I/O pad; and a high-side branch comprising a pair of back-to-back PMOS transistors with one PMOS transistor having a drain connected to the output and its gate driven by a PMOS drive path, and a second PMOS transistor connected to the power supply terminal, its source connected to the source of the first PMOS transistor and its gate driven by a cold-sparing signal that holds the second PMOS transistor ON during normal powered operation and that turns the second PMOS transistor OFF during cold-sparing, whereby a leakage path from the output to the power supply terminal is blocked when the integrated circuit is cold-spared with the power supply terminal at ground potential. Power-on reset circuitry is provided in some embodiments providing control signals to the cold-sparable output stages that disable the outputs and block leakage paths while the integrated circuit is not fully powered. In some embodiments, the cold-sparable output stages further comprise a cold-sparable human-body model (HBM) electrostatic discharge (ESD) protection circuit consisting of an NMOS transistor having a source and a gate both connected to the ground terminal, and a drain connected to an I/O pad that serves as a logic signal output.

In yet another embodiment, a cold-sparable HBM ESD protection circuit is connected to an I/O pad serving as a logic signal input. The input HBM ESD circuit consists of an NMOS transistor having a source and gate both connected to the ground terminal, and a drain connected to the I/O pad. In some embodiments, a cold-sparable charged-device model (CDM) ESD protection circuit connected to each logic signal input is provided, having a current-limiting series resistor $R_{CDM}$ connected between the logic signal input and a common node connected to internal circuitry of the integrated circuit, a first NMOS transistor having its drain connected to the common node and its source and gate both connected to the ground terminal, a second NMOS transistor having its source and gate connected to the common node and its drain connected to the source of a third NMOS transistor, whose gate and drain are connected to the power supply terminal, so that the third NMOS transistor blocks a leakage path from the logic signal input to the power supply terminal when the circuit is cold-spared.

In other embodiments, the majority voter with error detection integrated circuit incorporates triple or greater modular redundancy through replication of some or all of the circuit modules within the integrated circuit including some or all of the majority voters, disagreement detectors, and gates in the disjunctive error logic. The outputs of each set of replicated circuit modules are connected together at a summing node so that a sum of the output signals from the replicated circuit modules results in a signal at the summing node that is in agreement with the majority of the redundant circuit modules.

The present invention also provides a redundant electronic system to process a set of input signals, having an odd number of three or more redundant functional circuits configured to generate substantially identical output signals when operating correctly, all connected to the inputs of a majority voter with error detection. In some embodiments, the redundant electronic system includes a controller connected to the outputs of the majority voter with error detection and configured to provide to a controlled system one or more control signals based on the voter output and the detector output which may include a fault notification signal.

The present invention further provides a fault notification electronic system in which two or more subsystems, each having three or more subsystem outputs and configured to generate substantially identical signals at its subsystem outputs when operating correctly, are each connected by its subsystem outputs to the detector inputs of an error detector in a detector chain. The error detectors each have an external error input connected to the error output of a previous error detector in the detector chain, and each error detector is configured to produce an error signal at its error output that is active when not all of the subsystem outputs connected to it agree, or when its external error input is receiving an active error signal from the previous error detector in the detector chain. The last error detector in the detector chain produces an active error signal when any of the subsystems produces subsystem output signals that do not all agree. In some embodiments, the error output of the last error detector is connected to the input of a system controller configured to produce a fault notification signal at a fault notification output when any of the subsystems produces subsystem output signals that do not all agree.

Other features and advantages of the present invention will be apparent to those skilled in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMEINTS

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

Each signal described herein may be designed using positive or negative logic, where negative logic can be indicated by a bar over the signal name or "_BAR" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals, and therefore in alternate embodiments, those signals described as positive logic signals may be implemented as negative logic signals, and vice versa. As is known by those skilled in the art, combinational logic may be implemented equivalently in alternate embodiments that operate on opposite-polarity logic signals by applying De Morgan's laws.

Figure 1:
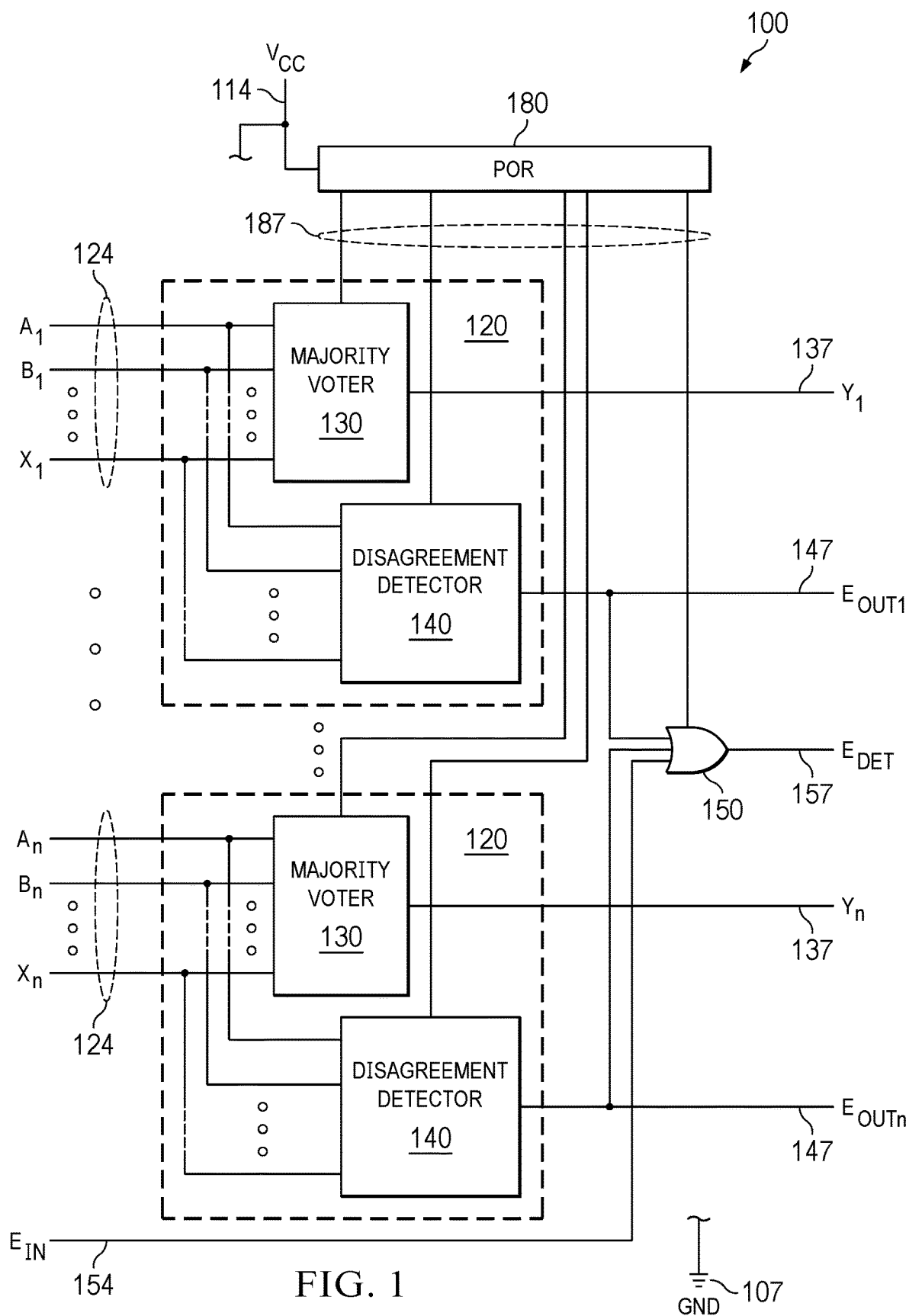
FIG. 1 is schematic block diagram of an integrated circuit containing majority voters with error detection and error feedthrough.

Referring now to FIG. 1, a schematic block diagram of an exemplary integrated circuit 100 containing a number n of majority voters with error detection 120 is shown. A single integrated circuit 100 may contain more than one block 120 of digital majority voters 130 and disagreement detectors 140; two blocks are shown in FIG. 1 to indicate this, where triple dots are used to indicate that additional blocks may be included in the same IC 100 in between the illustrated blocks. Similarly, each block 120 may have a number of logic signal inputs 124, labeled $A_1$, $B_1$, through $X_1$ for the first block 120 shown in the top part of FIG. 1 (with the letter X used to imply an arbitrary number of logic signal inputs in each set of inputs), and $A_n$, $B_n$, through $X_n$ for the nth block 120 shown in the bottom part of FIG. 1.

Each block 120 contains a digital majority voter 130 and a corresponding disagreement detector 140. Voter 130 and detector 140 share the same set of logic signal inputs; each of the logic signal inputs in a set for a particular block is connected both to a voter input and to a corresponding detector input. The number of logic signal inputs may be three or greater in order to unambiguously generate a majority signal, and is preferably an odd number to preclude the possibility of a tie which would make the voter output indeterminate. Digital majority voter 130 produces a voter logic signal output 137 equal to the logical value of a majority of the voter inputs. The voter output 137 that transmits the majority value of the first block 120 is labeled $Y_1$ herein, and is made available externally to the IC as a logic signal output. Disagreement detector 140 produces an error signal 147 at its detector output that is active when not all of its detector inputs agree (or, equivalently, when not all of the voter inputs agree). That is, using positive logic as in this example, error signal 147 is HIGH when one or more of logic signal inputs 124 differs from any other. Error signal 147 corresponding to the error output from the first block 120 is labeled $E_{OUT1}$ herein, and is also made available externally as a logic signal output. A power supply terminal 114 and ground terminal 107 are used to provide power and reference potentials to the circuits within IC 100.

IC 100 optionally contains disjunctive error logic 150 to combine error signals into a single "error detected" signal 157 ($E_{DET}$). In embodiments using positive logic (active HIGH) as in the illustrated examples, disjunctive error logic 150 may take the form of an OR gate as drawn in FIG. 1. Error output 157 is also supplied externally to circuits outside the IC, and indicates when any of the inputs of disjunctive error logic 150 are receiving an active error signal. Disjunctive error logic 150 may have more or fewer inputs than shown in the example of FIG. 1, since it may have as many inputs as there are blocks 120, and may also receive an external error signal 154 from an external error input. The external error input is labeled EIN herein, and error logic 150 effectively provides a "feedthrough" of external error signal 154 to $E_{DET}$ error output 157. Only one external error input 154 is shown in the exemplary embodiment of FIG. 1, but a greater number of external error inputs 154 may be implemented, so that IC 100 may be capable of merging error signals from several external error signal sources. Externally-generated error signals may have a variety of meanings besides disagreement of redundant functional circuits, depending on how they are generated; but in any case, external error signals 154 may be merged by disjunctive error logic 150 with error signals 147 generated within IC 100 to produce a generalized fault signal indicating any kind of error. In the case that error signals 154 indicate disagreement amongst multiple redundant functional circuits that are supposed to be generating nominally identical signals, the circuits that generate external error signals 154 may include additional instances of IC 100 capable of producing $E_{OUT}$ or $E_{DET}$ logic signal outputs from their disagreement detectors 140 or from their own feedthrough disjunctive error logic 150.

Figure 3A:
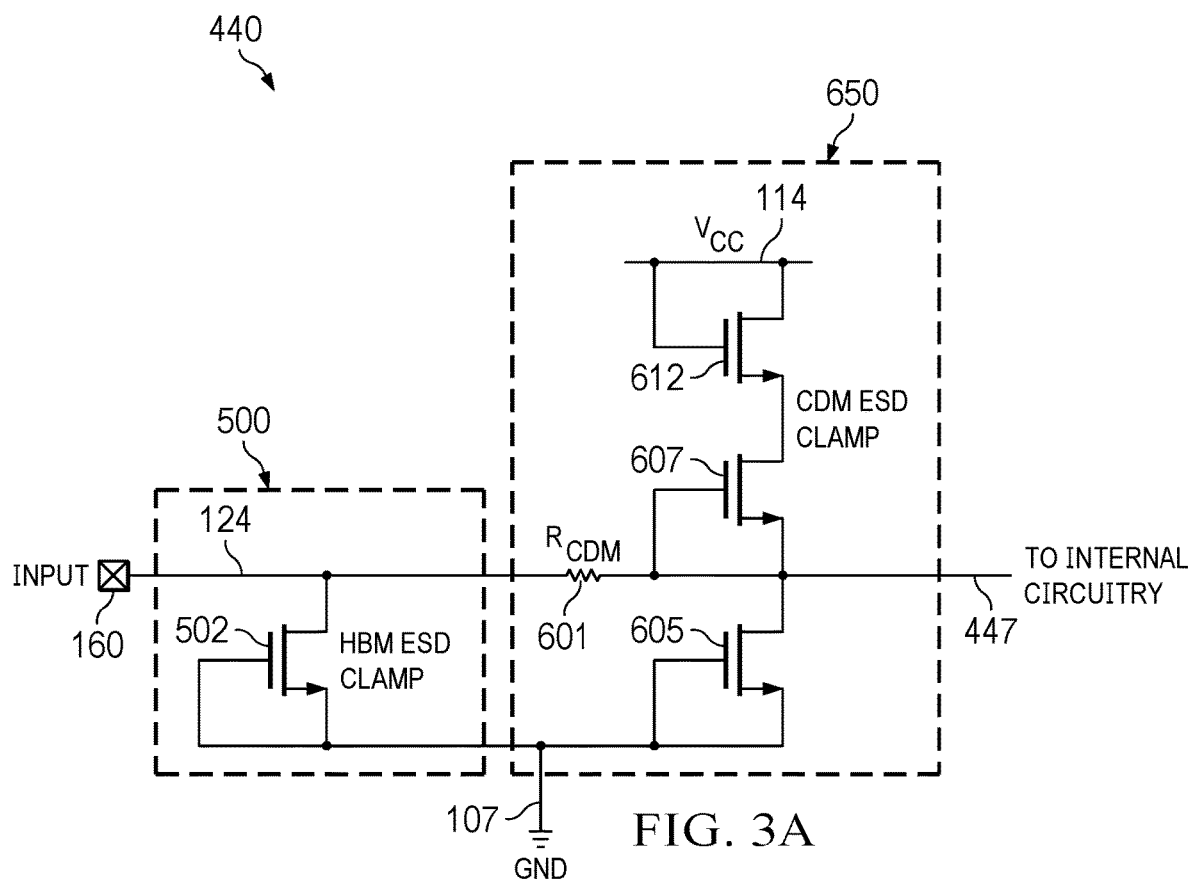
FIG. 3A is a schematic circuit diagram of a cold-sparable input electrostatic discharge protection circuit.
Figure 3B:
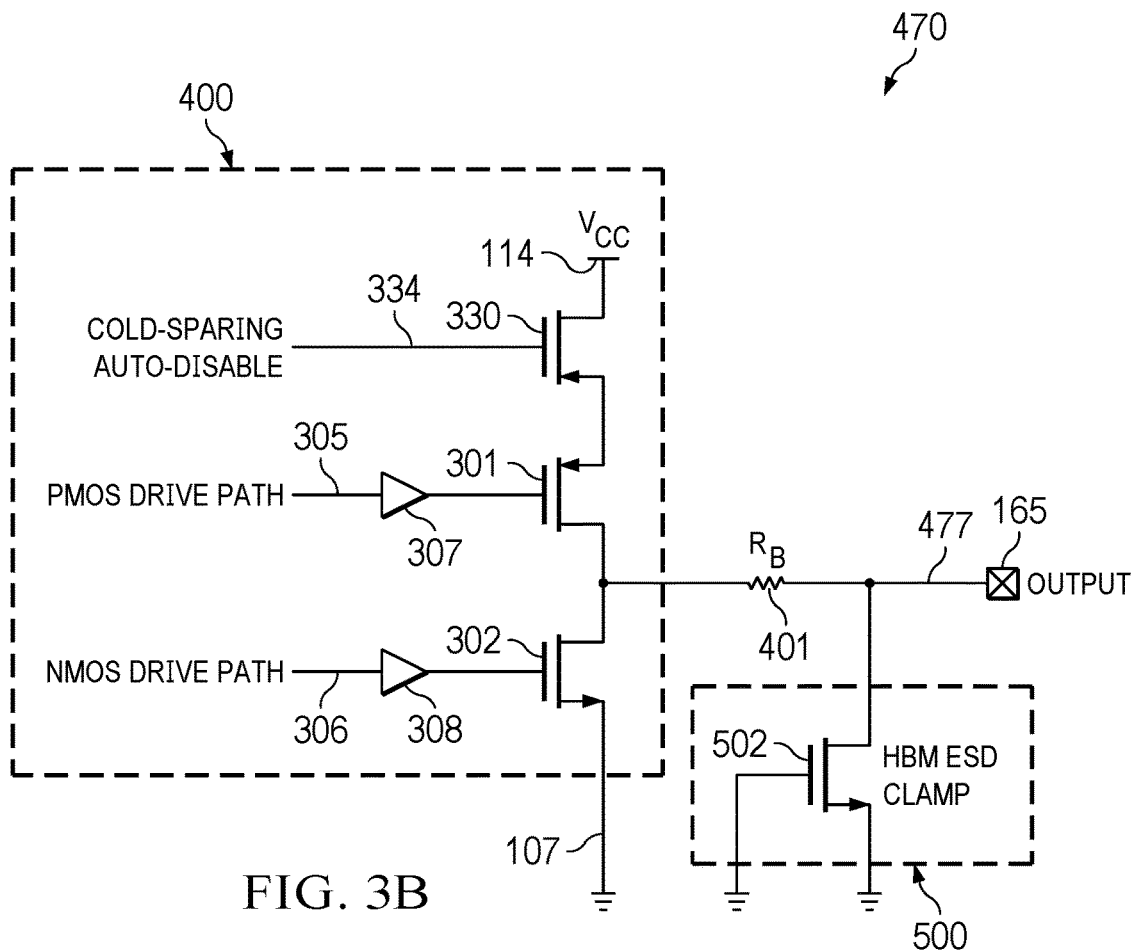
FIG. 3B is a schematic circuit diagram of a cold-sparable output stage with electrostatic discharge protection.

In order to support low-leakage cold-sparing (preventing leakage paths from inputs and outputs to either power supply terminal 114 or ground terminal 107 depending on the powered status of IC 100) and orderly power-up with low leakage when hot-plugging, special cold-sparable input and output circuitry in IC 100 may optionally be used on inputs 124 and 154, and outputs 137, 147, and 157. Exemplary embodiments of these features will be described in more detail with reference to FIGS. 3A and 3B. Cold-sparing and hot-plugging capabilities of IC 100 may be supported by power-on reset (POR) circuitry 180 as shown in FIG. 1. POR circuitry 180 monitors the state of power supply terminal 114 ($V_{CC}$) and supplies POR control signals 187 to various circuitry within IC 100, and in particular to cold-sparable output stages, an example of which is shown in FIG. 3B.

Figure 2A:
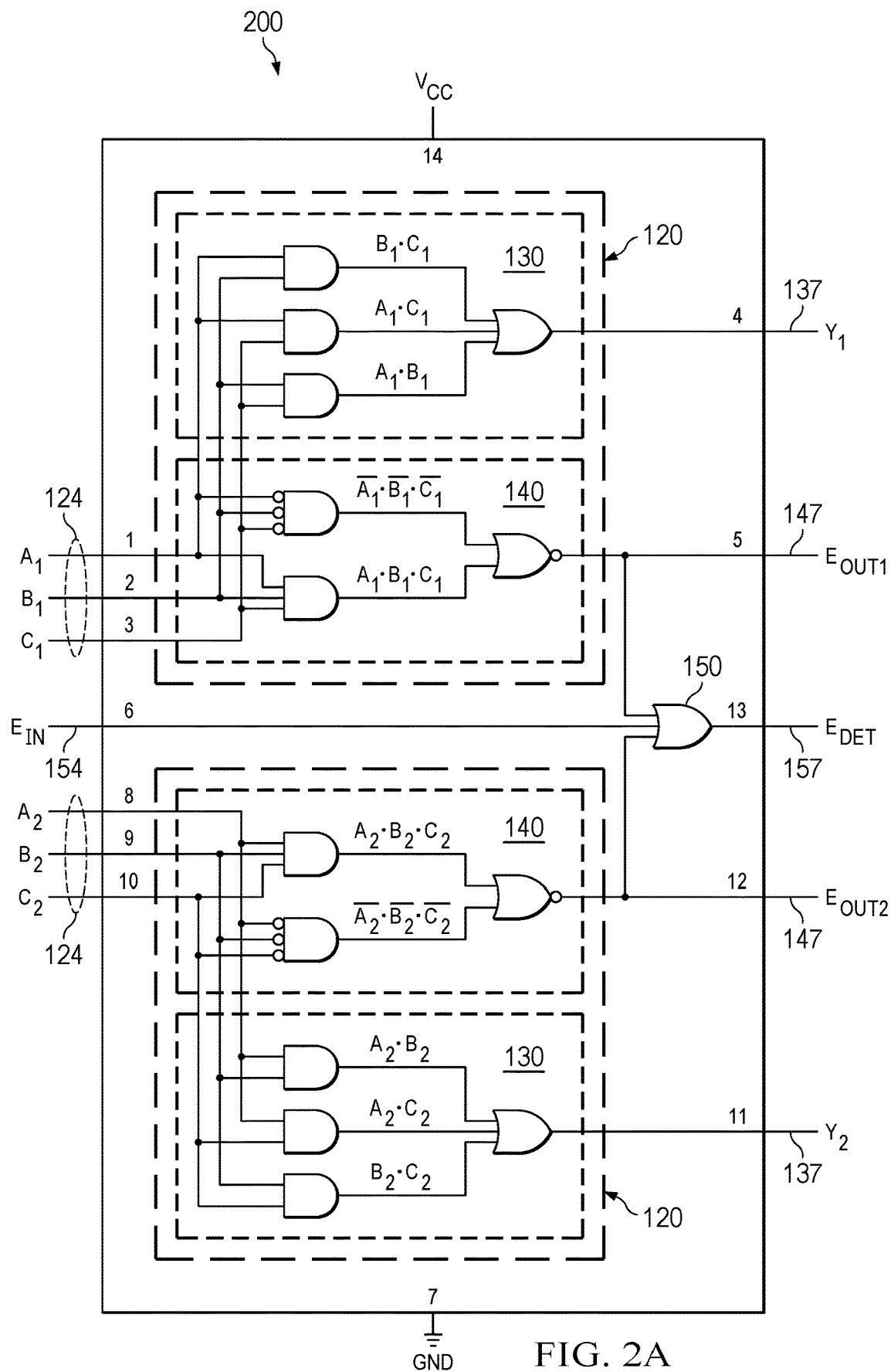
FIG. 2A is a schematic logic diagram of a dual majority voter integrated circuit with error detection and error feedthrough.

Referring now to FIG. 2A, a schematic logic diagram of a dual three-input majority voter integrated circuit 200 with error detection and feedthrough is shown. Dual voter IC 200 contains two blocks 120 (each containing a majority voter 130 and a disagreement detector 140), and also contains one set of disjunctive error logic 150 (represented as a single OR gate) driving an error output 157 (labeled $E_{DET}$). Blocks 120 accept separate sets of logic signal inputs 124, namely $A_1$, $B_1$, $C_1$ and $A_2$, $B_2$, $C_2$. Each block 120 also has a voter output 137 and a detector output error signal 147, labeled respectively $Y_1$ and $E_{OUT1}$ for the upper half of FIG. 2A, and $Y_2$ and $E_{OUT2}$ for the lower half of FIG. 2A. Disjunctive error logic 150 also accepts an external error input 154.

FIG. 2A illustrates a schematic logic diagram of one possible logic circuit implementation of majority voters 130 and disagreement detectors 140. Annotations for intermediate signals within the circuit modules 130 and 140 are given showing Boolean logic expressions for these signals as an aid in understanding the function of the exemplary embodiments shown. These annotations use conventional logic circuit notation such as bars over a signal name to indicate the inverse or complement of the signal, and dots as in $A_1 \cdot B_1$ to indicate conjunction (a logical AND operation). A rectangular border around the logic diagram symbolizes an integrated circuit package having terminals (which may be pins, pads, leads, lands, or balls depending on the package type) with terminal numbers written next to signal lines where they enter or exit the rectangular border. For the exemplary dual voter IC 200, all inputs and outputs may be connected externally by using an IC package having 14 terminals.

A possible logic circuit implementation of a digital majority voter 130 having three inputs is shown, in which three pairs of inputs 124 are applied to the inputs of three AND gates whose outputs are connected to the inputs of a three-input OR gate to generate voter output signal 137. Alternative embodiments may perform the same function using different gates and connections and different-polarity logic signals, as stated previously. Similar design principles may also be applied to implement majority voters with error detection that process larger numbers of inputs 124 for each block 120.

A possible logic circuit implementation of a disagreement detector 140 having three inputs is also shown, in which the three inputs 124 are applied in noninverted form to the input of a first three-input AND gate, and also all three inputs 124 are applied in inverted form to a second three-input AND gate; the outputs of the two AND gates are connected to the inputs of a two-input NOR gate to generate error signal 147. Those skilled in the art will appreciate that other alternative embodiments are also possible for disagreement detector 140, and that the illustrated exemplary embodiment is not the only possible combination of logic implementations for the circuit modules 130 and 140 within block 120.

Figure 2B:
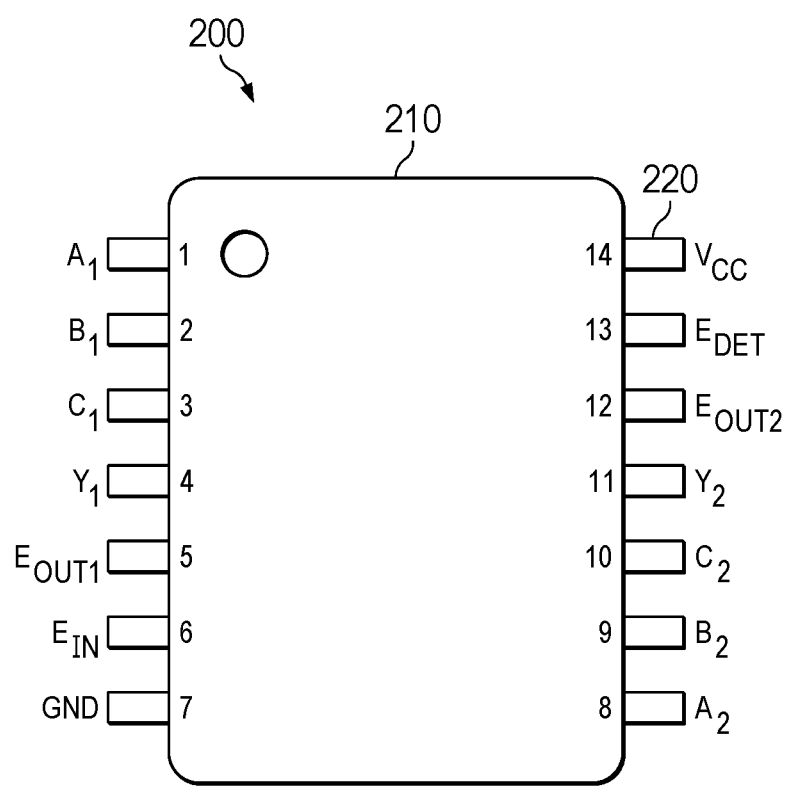
FIG. 2B is a schematic drawing of a packaged embodiment of the dual majority voter integrated circuit of FIG. 2A.

FIG. 2B shows a schematic drawing of a packaged embodiment of dual voter IC 200 with package 210 and leads 220. Signal labels and pin (leads) numbers correspond to the logic circuit implementation shown in FIG. 2A. All 14 pins (leads) of the package are used for the combination of functions and I/O implemented in FIG. 2A, in addition to power ($V_{CC}$) and ground leads on pins 14 and 7, respectively. The type of package illustrated is representative of a leaded 14-pin TSSOP (Thin Slim Small Outline Package), which has the 14 leads arranged in two rows. A variety of other 14-pin package types (having terminals which may be pins, pads, leads, lands, or balls depending on the package type) could alternatively be used to encapsulate dual voter IC 200, and need not have the terminals arranged in two rows.

Inputs and outputs for a packaged integrated circuit 100, such as dual majority voter IC 200, that are connected to package leads exposed to external signals and the environment, such as package leads 220 that may experience handling and assembly, frequently require electrostatic discharge (ESD) protection circuitry to protect internal circuitry in IC 100. Cold-sparable input ESD protection circuitry 440 for an input pin (lead) of IC 100 is shown in the schematic circuit diagram of FIG. 3A. An embodiment of the invention incorporating this type of input circuitry is not only protected from ESD, but is also cold-sparable, meaning that when IC 100 is cold-spared, i.e., unpowered, and with power supply terminal 114 at or near ground potential, and power supply potentials $V_{CC}$ from active ICs in parallel with IC 100 are applied to an input, then leakage currents due to normal supply voltages appearing at an I/O pad (here an input pad 160) are blocked by ESD protection circuitry 440.

Input ESD protection circuitry 440 preferably includes two types of ESD circuitry, a human-body model (HBM) ESD clamp, and a charged-device model (CDM) ESD clamp. Cold-sparable embodiments of these two types of ESD circuits are shown in FIG. 3A. An exemplary cold-sparable HBM ESD clamp 500 comprises an NMOS transistor 502 connected as shown, with its drain connected to the logic input signal 124 that originates at input pad 160, and its gate and source connected to ground terminal 107. This HBM ESD circuit ensures that leakage currents due to normal supply voltages appearing at input 160 are blocked, but an excessively high positive voltage such as that due to an electrostatic discharge is clamped to ground potential through a breakdown mechanism in NMOS transistor 502, while a negative voltage applied to input pad 160 is clamped to ground terminal 107 by the body diode of NMOS transistor 502.

A cold-sparable CDM ESD clamp 650 is also shown in FIG. 3A. Cold-sparable CDM clamp 650 includes a current-limiting series resistor 601 ($R_{CDM}$) that typically has a value on the order of one to ten kilohms connected to a common output node 447 that is in turn connected to internal circuitry of IC 100. A low-side CDM clamp NMOS transistor 605 is connected similarly, and functions similarly, to HBM ESD clamp transistor 502, with its gate and source connected to ground, and its drain connected to common node 447. The high-side CDM clamp circuit includes a second NMOS transistor 607 with its gate and source connected to common node 447, and a third NMOS transistor 612 with its gate and drain connected to power supply terminal 114, and its source connected to the drain of transistor 607, so that the second and third NMOS transistors are in series. Third NMOS transistor 612 serves to block a leakage path that might be caused by a power supply voltage $V_{CC}$ appearing at input 160, that is, from logic signal input 124 to power supply terminal 114 when the circuit is cold-spared with power supply terminal 114 at a low potential such as ground potential.

Next, referring now to FIG. 3B, a schematic circuit diagram is shown of output circuitry 470 that includes a cold-sparable output stage with output ESD protection. A similar cold-sparable HBM clamp 500 to that used on inputs is connected to an output pad 165, and consists of an NMOS transistor 502 with its gate and source connected to ground 107 and its drain connected to output node 477 and thence to output pad 165.

A simplified embodiment of a cold-sparable output stage 400 is also illustrated in FIG. 3B as part of output circuitry 470. Output stage 400 has a low-side branch with an NMOS transistor 302 driven by a signal from a low-side NMOS drive path 306, with appropriate signal levels from internal circuitry to IC 100 represented symbolically by NMOS drive buffer 308. The output stage also has a high-side branch that has a PMOS transistor 301 connected as shown, with its drain connected to the drain of NMOS 302, and its gate driven by a high-side PMOS drive path 305 through symbolic PMOS drive buffer 307. The source of PMOS 301 is connected to the source of second PMOS transistor 330, whose gate is controlled by cold-sparing auto-disable signal 334, which may be one of the signals 187 generated by POR circuitry 180 shown in FIG. 1. The source of PMOS 330 is connected to power supply terminal 114. During cold-sparing, second PMOS 330 is held OFF by cold-sparing signal 334, so that a leakage path from output pad 165 to power supply terminal 114 is blocked. Ballast resistor 401 (RB), having a value typically in the tens of ohms, may be used to limit output currents of cold-sparable output stage 400. As will be seen next, multiple output stages 400 may be connected together in parallel to a summing node to implement modular redundancy, and in such cases each output stage may have a ballast resistor 401 in its path leading to the summing node.

Figure 4:
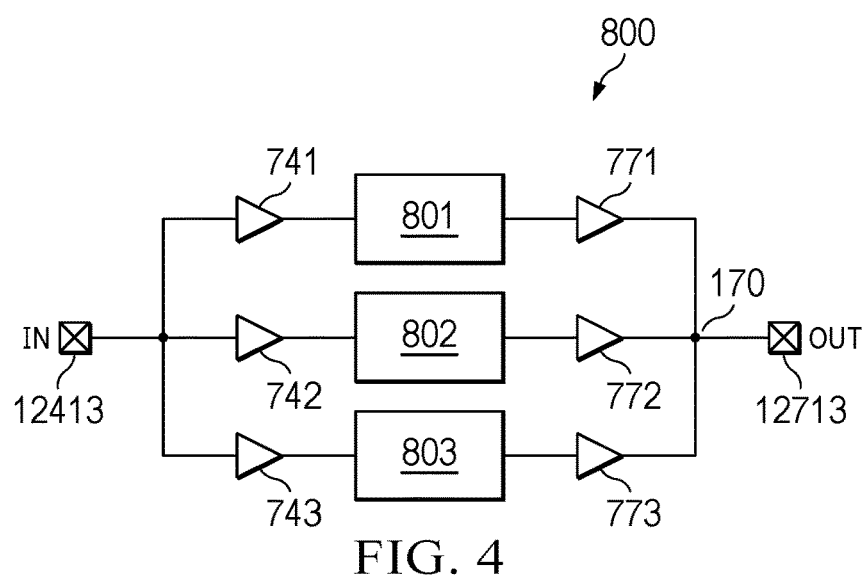
FIG. 4 is a schematic block diagram of a redundant circuit having end-to-end triple modular redundancy.

FIG. 4 shows a schematic block diagram of a conceptual circuit 800 to implement end-to-end redundancy in IC 100 according to a principle of the present invention. Three parallel signal paths (resulting in triple modular redundancy) is a minimum number to allow unambiguous majority voting at the output. In triple modular redundant circuit 800, a signal at input pad 12413 is split three ways and applied to input buffers 741, 742, and 743 that amplify the split signal as needed to drive three replicated redundant functional circuit modules 801, 802, and 803, respectively. These redundant functional circuit modules operate identically, in that they all are configured to generate the same output signal when presented with the same input signal. The outputs of redundant circuit modules 801, 802, and 803 are connected to and conditioned by respective output buffers 771, 772, and 773. Output buffers 771, 772, and 773 are shown separately to illustrate the concept, but may be considered to be incorporated within circuit modules 801, 802, and 803 if the output signal strengths of modules 801, 802, and 803 are sufficiently strong to produce reliable summation at summing node 170. The three output signals of modules 801, 802, and 803 are summed in an analog fashion at summing node 170 so that if one of the modules produces a different output logic signal for the same input that disagrees with the output logic signals of the other two modules, for example in the case of an erroneous output caused by a single-event effect or other failure, then the summation of the signals results in an output logic signal at node 170 connected to output pad 12713 that agrees with a majority of the redundant modules. When IC 100 is implemented in a logic technology such as CMOS and the output stages of modules 801, 802, and 803 are properly sized, the correct signals produced by a majority of the redundant modules will dominate over an erroneous signal from the outputs of a minority of the nominally identical modules, and result in a summed output signal that will act as a correct output logic signal. Thus, there is not a single point of failure that will result in an incorrect output signal. This summation acts as an analog majority voter that produces a valid output logic signal, and works for any number of redundant circuit modules that is three or greater.

Figure 5A:
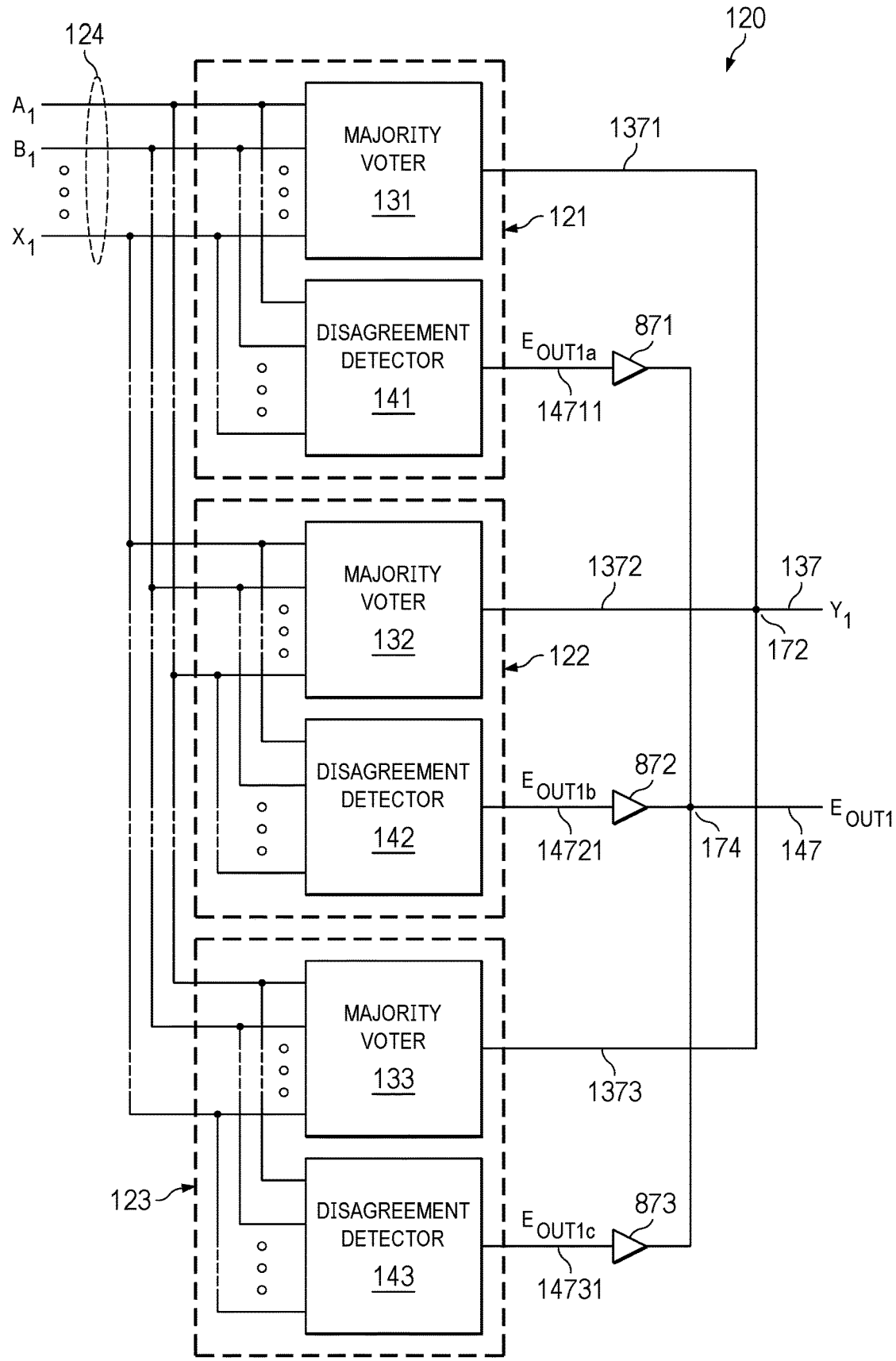
FIG. 5A is a schematic circuit diagram showing a triple modular redundant implementation of a majority voter with error detection.
Figure 5B:
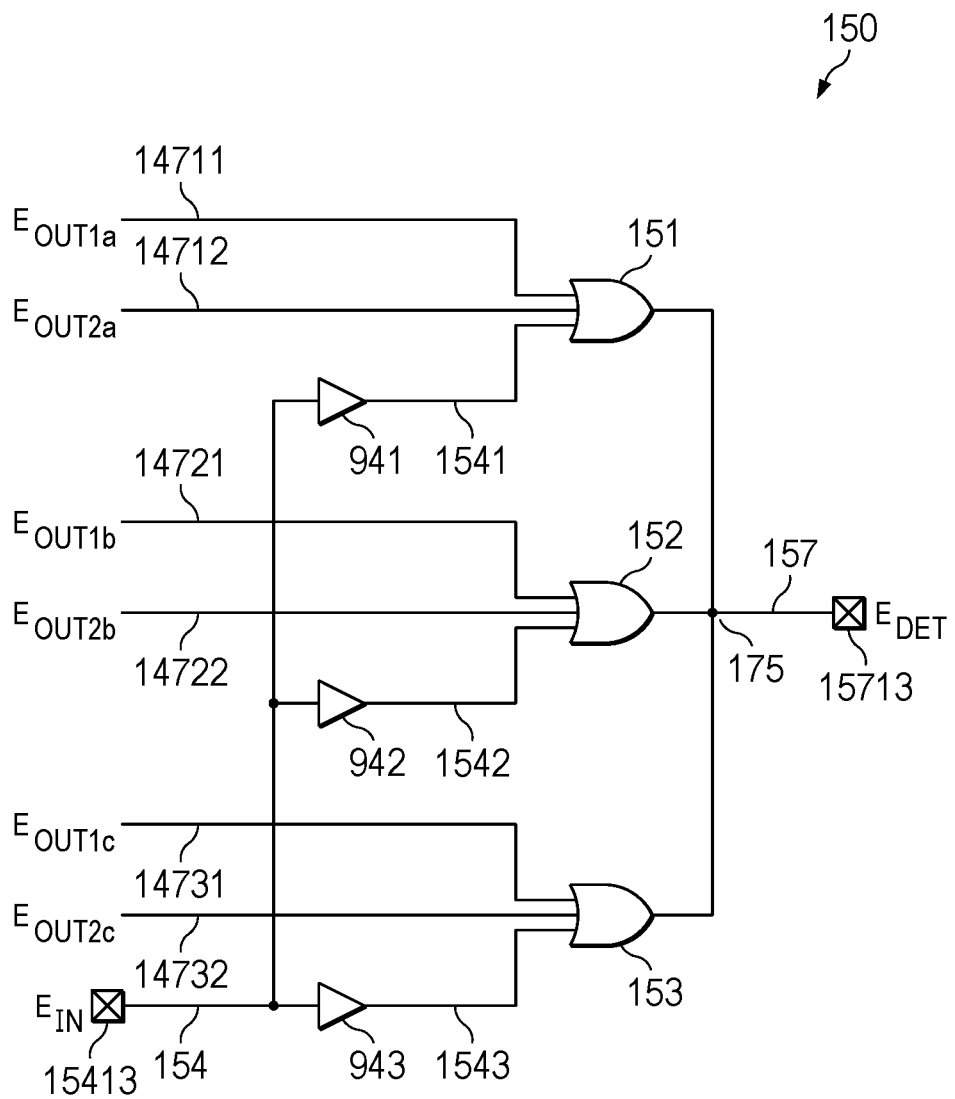
FIG. 5B is a schematic circuit diagram showing a triple modular redundant implementation of disjunctive error logic for combining outputs from error detectors and an external error input.

Application of the end-to-end triple modular redundancy concept to circuit modules within IC 100 is now described in connection with FIGS. 5A and 5B. FIG. 5A is a schematic circuit diagram illustrating how triple modular redundancy (TMR) using analog majority voting may be applied to majority voters and disagreement detectors within IC 100, specifically to implement a TMR version of a single voter block 120 with error detection, which contains both redundant majority voters and redundant disagreement detectors. Block 120 contains three redundant sub-blocks 121, 122, and 123, all connected to the same set of inputs 124 ($A_1$, $B_1$, through $X_1$), each sub-block containing a majority voter and a disagreement detector. First sub-block 121 contains first majority voter 131 producing first voter output 1371 and first disagreement detector 141 producing first detector output 14711 ($E_{OUT1a}$); second sub-block 122 contains second majority voter 132 producing second voter output 1372 and second disagreement detector 142 producing second detector output 14721 ($E_{OUT1b}$); and third sub-block 123 contains third majority voter 133 producing third voter output 1373 and third disagreement detector 143 producing third detector output 14731 ($E_{OUT1c}$). The three voter outputs 1371, 1372, and 1373 are summed at voter summing node 172 to produce a single resultant voter output 137 (Y 1). Although there are no output buffers explicitly shown, it will be understood that the output stages of majority voters 131, 132, and 133 are sized properly and sufficiently robust to produce a valid summation at summing node 172. Similarly, the three detector output signals 14711, 14721, and 14731 are summed (after being buffered by detector output buffers 871, 872, and 873) at detector summing node 174 to produce a single resultant error output 147 ($E_{OUT1}$). Buffers 871, 872, and 873 are included in the schematic as a reminder that summing node 174 must be driven with sufficient signal strength to function properly, while detector output signals 14711, 14721, and 14731 may simultaneously be applied to other circuitry as shown in FIG. 5B, which can affect the loading on signals 14711, 14721, and 14731. Thus, analog majority voting produces voter and detector output signals 137 and 147 that are resilient to transient or permanent failures of one of the three parallel redundant voter or detector modules. In general, analog majority voting can be used with any number three or more redundant modules, and will produce a correct output if fewer than half of the redundant modules produces an erroneous output signal at a given time.

Now referring to FIG. 5B, a schematic circuit diagram of a triple modular redundant (TMR) implementation of disjunctive error logic 150 is shown. This schematic illustrates disjunctive error logic 150 as implemented for a dual majority voter IC 200, having two blocks 120 with majority voter and error detection, and a single external error input 154 ($E_{IN}$) arriving from input pad 15413, split three ways, and amplified by error input buffers 941, 942, and 943 to ensure that the split signal is strong enough to drive three gate inputs. Input and output ESD circuitry as in FIGS. 3A and 3B, although not shown in FIGS. 5A or 5B, may be included, and cold-sparable output circuitry as in FIG. 3B (also not shown) may also be incorporated.

Triple modular redundant disjunctive error logic 150 shown in FIG. 5B consists of three OR gates, first OR gate 151, second OR gate 152, and third OR gate 153, whose outputs are summed at summing node 175 to generate a single "error detected" signal 157 ($E_{DET}$) that is sent to output pad 15713. Each OR gate combines the error signals from the two disagreement detectors in the two blocks 120 of dual IC 200, and a copy of the "feedthrough" external error input signal 154. Specifically, first OR gate 151 receives, at its inputs, three signals: detector outputs 14711 ($E_{OUT1a}$) and 14712 ($E_{OUT2a}$) from the first redundant disagreement detector sub-block (e.g., 141) in each of the two blocks 120, and buffered split signal 1541, which is a copy of external error input 154 buffered by error input buffer 941. Similarly, second OR gate 152 receives, at its inputs, the detector outputs 14721 and 14722 ($E_{OUT1b}$ and $E_{OUT2b}$) from the second redundant disagreement detector sub-blocks in the two blocks 120, and $E_{IN}$ 154 buffered by error input buffer 942 to produce buffered signal 1542; and third OR gate 153 receives, at its inputs, detector outputs 14731 and 14732 ($E_{OUT1c}$ and $E_{OUT2c}$) from the third redundant disagreement detectors in the two parts of dual IC 200, and $E_{IN}$ 154 buffered by error input buffer 943 to produce buffered signal 1543. By splitting the signals into three paths in this way, error output 157 is insensitive to transient or other errors in individual OR gates 151, 152, and 153, so that there is no single point of failure in the error detection and feedthrough paths. This technique can be extended to accommodate more voter blocks with error detection 120 by increasing the number of inputs on each OR gate; and to higher levels of redundancy than triple redundancy by increasing the number of OR gates.

Figure 6A:
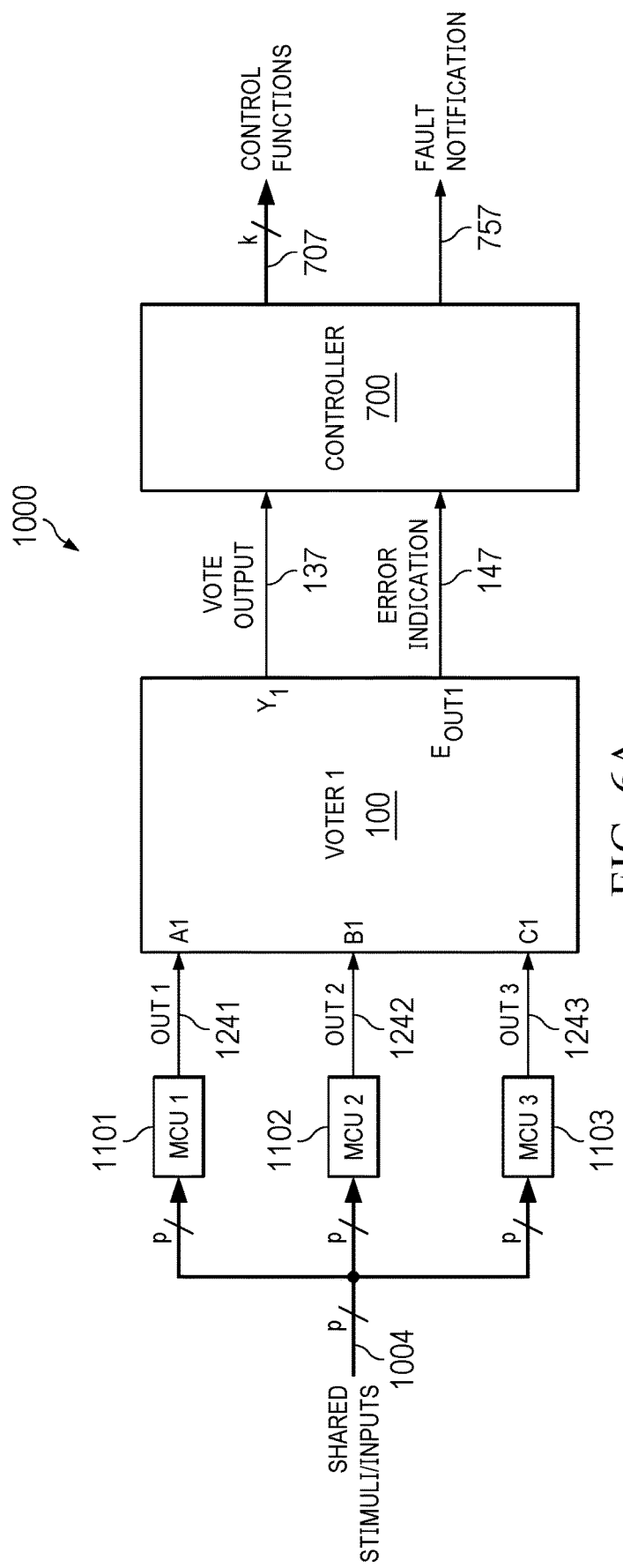
FIG. 6A is a schematic block diagram of a triple modular redundant fault-tolerant system using a majority voter with error detection.

A schematic block diagram of a redundant electronic system 1000 that makes use of a majority voter with error detection IC 100 is shown in FIG. 6A. In this embodiment, three redundant functional circuits 1101, 1102, and 1103 each receive a copy of the same shared stimuli/inputs 1004, which may consist of a number p of stimulus signals. For example, the redundant functional circuits 1101, 1102, and 1103 may be microcontroller units (MCU 1, MCU 2, and MCU 3, respectively) configured to generate nominally identical output signals 1241 (OUT1), 1242 (OUT2), and 1243 (OUT3), respectively, when given the same set of input stimulus signals 1004. One of the majority voter with error detection blocks 120 (VOTER 1) within IC 100 has its three inputs $A_1$, $B_1$, and $C_1$ connected to redundant signals 1241, 1242, and 1243, respectively, and is used to provide a voter output 137 ($Y_1$) and an error signal 147 ($E_{OUT1}$, error indication) to inputs of optional controller 700. Controller 700 may use voter output 137 and error signal 147 to provide a number k of control signals 707 (control function) to a controlled system, and may also generate a fault notification signal 757 for further processing or action in the controlled system. As discussed earlier, IC 100 may have more than one voter/error block 120, and one or more of these blocks 120 may accept more than three inputs, preferably an odd number. More than three redundant functional circuits could be processed by an IC 100 that has more than three logic signal inputs 124 as described in the preceding paragraphs. If it contains more than one voter (e.g., as in IC 200 of FIGS. 2A and 2B), then IC 100 may be used to process more than one set of redundant functional circuits like 1101, 1102, and 1103.

Figure 6B:
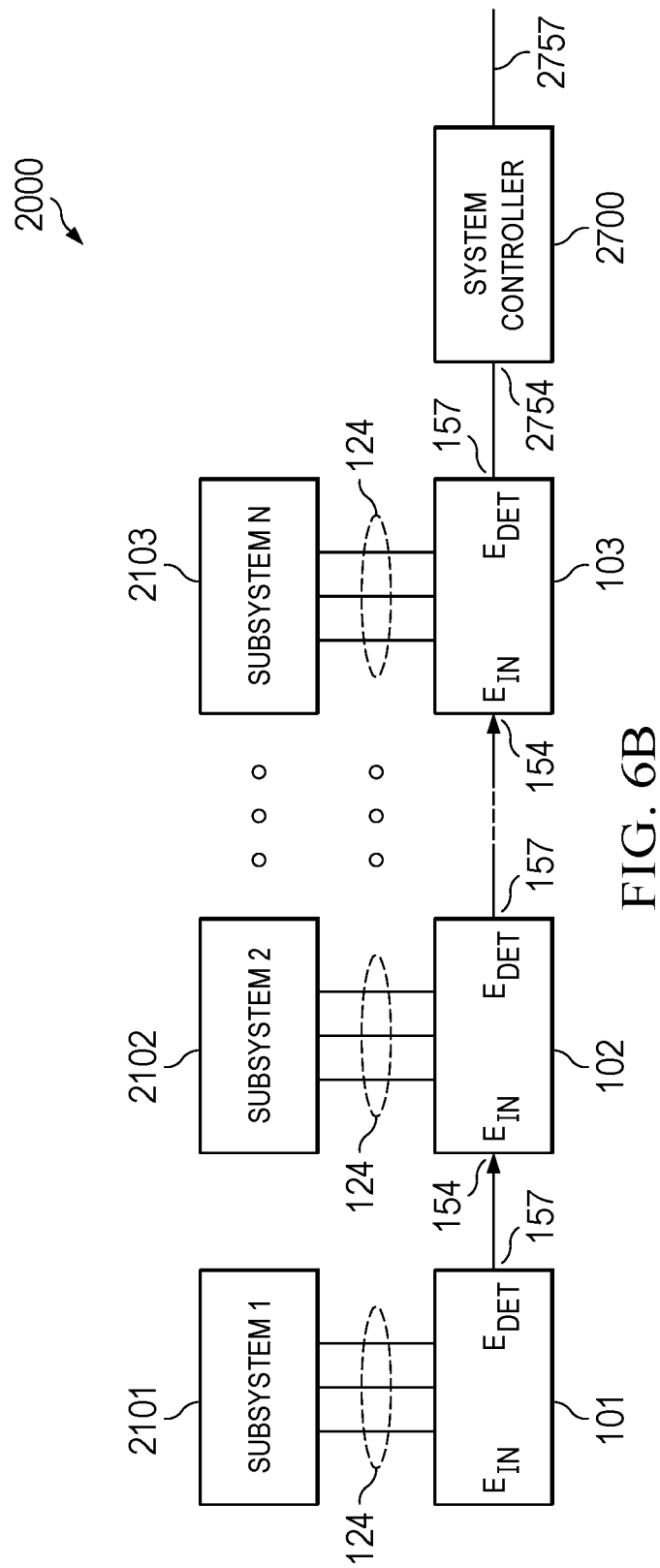
FIG. 6B is a schematic block diagram of a fault notification system using external error input feedthrough in serially connected error detectors.

Referring now to FIG. 6B, a schematic block diagram is shown of a fault notification system 2000 that makes use of feedthrough error logic for external error inputs. This system uses a serially-connected ("daisy-chain") set of error detectors to process the outputs of a number N of subsystems 2101, 2102, 2103, etc., so as to produce a single "error detected" signal indicating when there is an error in the outputs of any of the N subsystems, and provide the error signal to system controller 2700. A first subsystem 2101 (SUBSYSTEM 1) is configured (as are the other subsystems) to produce a set of outputs that are connected to, and serve as, logic input signals 124 into a first error detector 101. For the purpose of explaining the daisy chain error detector, these error detectors 101, 102, 103, etc., represent only the disagreement detector 140 and disjunctive error logic 150 portions of IC 100; the outputs of majority voter portions 130 may be used separately, for example, they could be provided as additional inputs to system controller 2700, or sent to other circuitry.

The fault notification system 2000 works as follows. First subsystem 2101 is connected to first error detector 101 through a set of signals 124. Error detector 101 generates an active error signal at error output 157 ($E_{DET}$) of first error detector 101 whenever not all of its input signals 124 agree, that is, when subsystem 2101 (SUBSYSTEM 1) is producing non-identical output signals, and hence may be experiencing a radiation-induced transient or otherwise may not be functioning properly. First error detector 101 need not have an external error $E_{IN}$ input, since it is not connected, but in most systems, error detectors 101, 102, and 103 may be identical, so that they all have the same sets of inputs and outputs. Output 157 of first error detector 101 is connected to external error input 154 of second error detector 102, which is processing signals 124 from second subsystem 2102. The disjunctive error logic 150 within second error detector 102 will produce an active error detected signal at its error output 157 when either of subsystem 2101 or subsystem 2102 is providing non-identical output signals. Error signaling is connected from $E_{DET}$ 157 to $E_{IN}$ 154 between error detectors serially as shown from first error detector 101 through last error detector 103 to process the output signals for all N subsystems, and generate a single "error detected" signal 157 at the error output of last error detector 103 that can be used as by itself, or can optionally be connected to the input 2754 of a system controller 2700, which can generate a fault notification signal at fault notification output 2757 and/or take other action.

In addition to the modular redundancy techniques previously described with reference to FIGS. 4, 5A, and 5B, the radiation tolerance of integrated circuits according to the present invention may be further enhanced using additional Radiation Hardening By Design (RHBD) techniques at the device level (transistor design), and circuit level (gate and other types of redundancy), in various combinations, to improve device and circuit resilience. Particular rad-hard IC fabrication processes can also enhance radiation performance. However, circuits and systems provided by the present invention may be implemented by applying these designs and methods using high-performance commercial IC processes and can provide increased radiation tolerance without requiring the use of specialized rad-hard fabrication processes.

The present invention provides useful components and systems for applications demanding radiation tolerance and high reliability. While some exemplary applications have been illustrated herein, embodiments of the invention are also applicable to systems requiring resilience or fault tolerance that are subjected to environments or hazards other than ionizing radiation.

While the present invention has been particularly shown and described in detail in the foregoing specification with reference to specific exemplary embodiments thereof, it will be evident that various modifications and changes may be made thereto without departing from the broader spirit and scope of the invention as set forth in the appended claims. For example, it will be apparent to those skilled in the art that while the present invention has been illustrated using examples from CMOS integrated circuit technology, other IC technologies using different materials and device configurations, or discrete device technologies may be used to implement some of the inventive principles that are described. Additional components and conventional connections not explicitly drawn or described, such as power supply and bypass connections, and any required pull-up resistors or loads or alternative input or output configurations constituting standard practice may be used in implementing embodiments without departing from the spirit and scope of the invention as set forth in the appended claims.

We claim:

1. An integrated circuit for use in logic systems employing modular redundancy, comprising:
    a power supply terminal;
    a ground terminal;
    a plurality of logic signal inputs and outputs connected to I/O pads;
    a number M equal to one or more digital majority voters, each majority voter having an odd number of three or more voter inputs separately connected to a corresponding number of the logic signal inputs, each majority voter configured to produce at a voter output a logic signal having a value equal to a logical value of a majority of the voter inputs;
    M disagreement detectors, one corresponding respectively to each majority voter, each disagreement detector having the same number of detector inputs as its respective voter has voter inputs, each input of a disagreement detector connected to a logic signal input corresponding to a voter input on its respective voter, wherein each disagreement detector is configured to produce an error signal at a detector output that is active when not all of its detector inputs agree;
    an external error input;
    an error output; and disjunctive error logic having inputs respectively connected to the detector outputs and to the external error input and configured to generate a signal at the error output that is active when at least one of the detector outputs is producing an active error signal or the external error input is receiving an active error signal.

2. The integrated circuit of claim 1, further comprising an integrated circuit package having terminals connected to the inputs and outputs and encapsulating the integrated circuit.

3. The integrated circuit of claim 2, wherein M is equal to two.

4. The integrated circuit of claim 3, wherein the integrated circuit package has fourteen terminals arranged in two rows.

5. The integrated circuit of claim 1, further comprising a low-leakage cold-sparable CMOS output stage driving each output, comprising
- a low-side branch comprising a first NMOS transistor having a source connected to the ground terminal, a drain connected to an output, and a gate driven by an NMOS drive path, and
- a high-side branch comprising a pair of back-to-back PMOS transistors consisting of a first PMOS transistor having a drain connected to the drain of the first NMOS transistor, a gate driven by a PMOS drive path, and a source of the first PMOS transistor connected to a source of a second PMOS transistor, a drain of the second PMOS transistor being connected to the power supply terminal, a gate of the second PMOS transistor driven by a cold-sparing signal, the cold-sparing signal holding the second PMOS transistor ON during normal powered operation and turning the second PMOS transistor OFF during cold-sparing,
- whereby when the integrated circuit is cold-spared with the power supply terminal at ground potential, the pair of back-to-back PMOS transistors blocks a leakage path from the output to the power supply terminal.

6. The integrated circuit of claim 5, further comprising power-on reset circuitry providing control signals to the cold-sparable output stages that disable the outputs and block leakage paths from outputs that are subjected to nonzero voltages while the integrated circuit is not fully powered.

7. The integrated circuit of claim 1, further comprising a cold-sparable human-body model (HBM) electrostatic discharge protection circuit connected to at least one I/O pad, wherein the HBM protection circuit comprises
- an NMOS transistor having a source, a drain, a gate, and a body diode, wherein the source and gate are both connected to the ground terminal, and the drain is connected to the I/O pad,
- whereby leakage currents due to normal supply voltages appearing at the I/O pad while the integrated circuit is cold-spared are blocked, but an excessively high positive voltage applied externally to the I/O pad is clamped to the ground terminal by the NMOS transistor through a breakdown mechanism, and a negative voltage applied externally to the I/O pad is clamped to the ground terminal by the body diode, without loading valid logic signals at the I/O pad.

8. The integrated circuit of claim 1, further comprising a cold-sparable charged-device model (CDM) electrostatic discharge (ESD) protection circuit connected to at least one logic signal input, comprising
- a current-limiting series resistor $R_{CDM}$ having a first end and a second end, the first end connected to the logic signal input, the second end being connected to a common node of the CDM ESD protection circuit and connected to internal circuitry of the integrated circuit,
- a first NMOS transistor having a first source, a first drain, and a first gate, wherein the first source and the first gate are both connected to the ground terminal, and the first drain is connected to the common node,
- a second NMOS transistor having a second source, a second drain, and a second gate, wherein the second source and the second gate are connected to the common node, and
- a third NMOS transistor having a third source, a third drain, and a third gate, wherein the third source is connected to the second drain, and the third gate and the third drain are connected to the power supply terminal,
- whereby the third NMOS transistor blocks a leakage path from the logic signal input to the power supply terminal when the circuit is cold-spared with the power supply terminal at a low potential such as ground potential.

9. The integrated circuit of claim 1, wherein at least one of the M digital majority voters is an associated digital majority voter comprising three or more redundant digital majority voters, each redundant digital majority voter having the same number of redundant voter inputs as the number of voter inputs for the associated digital majority voter and connected to the corresponding logic signal inputs, and each redundant digital majority voter having a redundant voter output connected to a voter summing node, the voter summing node connected to the voter output for the associated digital majority voter,
- whereby in the presence of a single-event effect or other transient or permanent malfunction that affects circuits in fewer than half of the redundant digital majority voters, causing the output signals of fewer than half of the redundant voter outputs to differ from the output signals of the other redundant voter outputs, a sum of signals from the redundant voter outputs at the voter summing node results in a signal at the voter output of the associated digital majority voter that is in agreement with the majority of the redundant digital majority voters.

10. The integrated circuit of claim 9, wherein at least one of the M disagreement detectors is an associated disagreement detector comprising a number N equal to three or more redundant disagreement detectors, each redundant disagreement detector having the same number of redundant detector inputs as the number of detector inputs for the associated disagreement detector and connected to the corresponding logic signal inputs, and each redundant disagreement detector having a redundant detector output connected to a detector summing node, the detector summing node connected to the detector output for the associated disagreement detector,
- whereby in the presence of a single-event effect or other transient or permanent malfunction that affects circuits in fewer than half of the redundant disagreement detectors, causing the error signals at fewer than half of the redundant detector outputs to differ from the error signals of at the other redundant detector outputs, a sum of signals from the redundant detector outputs at the detector summing node results in a signal at the detector output of the associated disagreement detector that is in agreement with the majority of the redundant detector outputs.

11. The integrated circuit of claim 10, wherein the redundant detector outputs are not connected directly to a detector summing node, and wherein the disjunctive error logic comprises N redundant OR gates, each redundant OR gate having M redundant error inputs connected respectively to one of the N redundant detector outputs from each of the M disagreement detectors, no two redundant OR gates connected to the same redundant detector output, and another redundant error input connected to a copy of an error signal from the external error input, each redundant OR gate producing an output signal at a redundant OR gate output connected to a disjunctive summing node, whereby in the presence of a single-event effect or other transient or permanent malfunction that affects fewer than half of the copies of the error signal from the error input, or circuits in fewer than half of the redundant OR gates or redundant disagreement detectors, causing the output signals of fewer than half of the redundant OR gates to differ from the output signals of the other redundant OR gates, a sum of output signals from the redundant OR gate outputs at the disjunctive summing node results in a signal at the error output that is in agreement with the majority of the redundant OR gate outputs.

12. The integrated circuit of claim 1, wherein at least one of the M disagreement detectors is an associated disagreement detector comprising a number N equal to three or more redundant disagreement detectors, each redundant disagreement detector having the same number of redundant detector inputs as the number of detector inputs for the associated disagreement detector and connected to the corresponding logic signal inputs, and each redundant disagreement detector having a redundant detector output connected to a detector summing node, the detector summing node connected to the detector output for the associated disagreement detector, whereby in the presence of a single-event effect or other transient or permanent malfunction that affects circuits in fewer than half of the redundant disagreement detectors, causing the error signals at fewer than half of the redundant detector outputs to differ from the error signals at the other redundant detector outputs, a sum of signals from the redundant detector outputs at the detector summing node results in a signal at the detector output of the associated disagreement detector that is in agreement with the majority of the redundant detector outputs.

13. The integrated circuit of claim 12, wherein the redundant detector outputs are not connected directly to a detector summing node, and wherein the disjunctive error logic comprises N redundant OR gates, each redundant OR gate having M redundant error inputs connected respectively to one of the N redundant detector outputs from each of the M disagreement detectors, no two redundant OR gates connected to the same redundant detector output, and another redundant error input connected to a copy of an error signal from the external error input, each redundant OR gate producing an output signal at a redundant OR gate output connected to a disjunctive summing node, whereby in the presence of a single-event effect or other transient or permanent malfunction that affects fewer than half of the copies of the error signal from the error input, or circuits in fewer than half of the redundant OR gates or redundant disagreement detectors, causing the output signals of fewer than half of the redundant OR gates to differ from the output signals of the other redundant OR gates, a sum of output signals from the redundant OR gate outputs at the disjunctive summing node results in a signal at the error output that is in agreement with the majority of the redundant OR gate outputs.

14. The integrated circuit of claim 1, wherein the disjunctive error logic comprises three or more redundant OR gates, each having one or more redundant error inputs connected to a copy of a signal from each of the detector outputs and a redundant error input connected to a copy of a signal from the external error input, and each redundant OR gate producing an output signal at a redundant OR gate output connected to a disjunctive summing node, whereby in the presence of a single-event effect or other transient or permanent malfunction that affects fewer than half of the copies of the error signal from the error input, or circuits in fewer than half of the redundant OR gates or disagreement detectors, causing the output signals of fewer than half of the redundant OR gates to differ from the output signals of the other redundant OR gates, a sum of output signals from the redundant OR gates at the disjunctive summing node results in a signal at the error output that is in agreement with the majority of the redundant OR gate outputs.

15. A redundant electronic system to process a set of input signals, comprising:

an odd number of three or more redundant functional circuits each connected to the same set of input signals, the functional circuits each having an output and configured to generate substantially identical signals at their outputs when operating correctly and in the absence of radiation;

a digital majority voter having a number of voter inputs equal to the number of functional circuits, each voter input separately connected to an output of one of the functional circuits, the majority voter configured to produce at a voter output a logic signal having a value equal to a logical value of a majority of the voter inputs; and a disagreement detector having an external error input and a number of detector inputs equal to the number of voter inputs, each detector input separately connected to a corresponding voter input, the disagreement detector configured to produce an error signal at an error indication output that is active when either not all of its detector inputs agree or when the external error input is receiving an active error signal.

16. The redundant electronic system of claim 15, further comprising a controller having inputs connected to the voter output and to the error indication output, the controller configured to provide one or more control signals to a controlled system based on the logic signals at the voter output and the error indication output.

17. A fault notification electronic system comprising:

a plurality of subsystems enumerated from a first subsystem to a last subsystem, each subsystem having three or more subsystem outputs and configured to generate substantially identical signals at all its subsystem outputs when operating correctly and in the absence of radiation; and a plurality of error detectors, one associated with each subsystem and interconnected from a first error detector to a last error detector in a detector chain, each error detector having an error output, detector inputs connected to the outputs of its associated subsystem, and an external error input connected to the error output of a previous detector in the detector chain, each error detector configured to produce an error signal at its error output that is active when not all of the subsystem output signals at its detector inputs agree or when its external error input is receiving an active error signal, whereby the error output of the last detector is active when any of the subsystems produces subsystem output signals that do not all agree.

18. The fault notification electronic system of claim 17, further comprising a system controller having an input connected to the error output of the last error detector and having a fault notification output, the system controller configured to produce an active fault notification signal at the fault notification output in the event that any of the subsystems produces subsystem output signals that do not all agree.

19. The fault notification electronic system of claim 18, further comprising one or more majority voters, each majority voter associated with a subsystem and having voter inputs connected to the subsystem outputs, each majority voter configured to produce at a voter output a logic signal having a value equal to a logical value of a majority of the subsystem outputs, and at least one of the voter outputs connected to an input of the system controller.

20. The fault notification electronic system of claim 17, wherein the first error detector does not have an external error input.

\* \* \* \* \*